(12) United States Patent
Lee

(10) Patent No.: US 7,282,956 B2
(45) Date of Patent: Oct. 16, 2007

(54) HIGH VOLTAGE SWITCHING CIRCUIT OF NONVOLATILE MEMORY DEVICE

(75) Inventor: Seok Joo Lee, Seoul (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 83 days.

(21) Appl. No.: 11/299,191

(22) Filed: Dec. 9, 2005

(65) Prior Publication Data

US 2006/0214702 A1    Sep. 28, 2006

(30) Foreign Application Priority Data

Mar. 25, 2005   (KR) ...................... 10-2005-0024992

(51) Int. Cl.
*H03K 19/094*   (2006.01)
*H03K 19/0175*  (2006.01)
(52) U.S. Cl. .............................. 326/88; 326/80; 326/92; 327/536; 327/537
(58) Field of Classification Search ................. 326/63, 326/80, 88; 327/536–537
See application file for complete search history.

(56) References Cited

U.S. PATENT DOCUMENTS 7,157,957 B2 *   1/2007   Kim .......................... 329/390

2006/0044042 A1 *   3/2006   Kim .......................... 327/403

FOREIGN PATENT DOCUMENTS

| JP | 11-134892 A | 5/1999 |
| KR | 10-0281281 B1 | 11/2000 |
| KR | 10-2006-0057960 A | 5/2006 |
| KR | 10-2006-0101896 A | 9/2006 |

* cited by examiner

*Primary Examiner*—Anh Q. Tran
(74) *Attorney, Agent, or Firm*—Townsend and Townsend and Crew LLP

(57) ABSTRACT

A high-voltage switching circuit comprises: a high-voltage switch configured to transfer a high voltage; a pumping circuit configured to boost signals of first, second, and third nodes by conducting pumping operations in response to a plurality of clock signals; and a drive signal transmission circuit configured to boost the signal of the second node at a constant rate while maintaining a voltage level of the third node regardless of variation of a voltage level at the first node and transfer the boosted signal of the second node to the high-voltage switch, activating the high-voltage switch.

13 Claims, 8 Drawing Sheets

HIGH VOLTAGE SWITCHING CIRCUIT OF NONVOLATILE MEMORY DEVICE

BACKGROUND

The present invention relates to high-voltage switching circuits of nonvolatile memory devices and more particularly, to a high-voltage switching circuit shortening a boosting time of a drive signal activating a high-voltage switch.

In nonvolatile memory devices such as flash memories or EEPROMs, a high voltage (VPP) is needed for programming or erasing operations relative to other memory devices. The high voltage is internally generated and has a higher voltage than an external power source voltage (VCC). A high-voltage switch is required to switch to the high voltage VPP or to transfer the high voltage to a wordline. And, when the high-voltage switch includes an NMOS transistor, the high-voltage switch needs a voltage higher than the high voltage VPP that is applied to a gate of the NMOS transistor. For this, a boosting circuit for boosting the gate of the NMOS transistor may be required for the high-voltage switch.

FIG. 1 is a circuit diagram illustrating a conventional high-voltage switching circuit, including a high-voltage switch 11, a boosting enable unit 12, and a high-voltage switching booster 13.

Referring to FIG. 1, the high-voltage switch 11 includes an NMOS transistor N1 that transfers the high voltage VPP as an output signal VPPOUT, activated by a drive signal (i.e., a signal of a node NB) provided from the high-voltage switching booster 13.

The boosting enable unit 12 includes inverters IV1 and IV2, and an NMOS transistor N2, activating the high-voltage switching booster 13 in response to an enable signal EN.

The high-voltage switching booster 13 is provided to boost the drive signal (i.e., the signal of the node NB) for activating the high-voltage switch 11, high-voltage switching booster 13 including two capacitors Ca and Cb, and two NMOS transistors N3 and N4. NMOS transistor N2 is configured in the form of diode connection. The capacitors Ca and Cb respond respectively to clock signals CK and CKB, where clock pulse CKB is the inverse of clock pulse CK.

FIG. 2 illustrates waveforms of opposite clock signals CK and CKB, and FIGS. 3A through 3C illustrate an operation of the high-voltage switching booster 13 shown in FIG. 1. Hereinafter, the operation of the high-voltage switching booster 13 will be described with reference to FIGS. 2, and 3A through 3C.

The simplest way for boosting a signal or a node is to utilize the clock signals CK and CKB. As shown in FIG. 3A, one electrode of the capacitor Ca is coupled to the clock signal CK while the other electrode of the capacitor Ca is connected to the node NA. One electrode of the capacitor Cb is coupled to the clock signal CKB while the other electrode of the capacitor Cb is connected to the node NB. Thus, the nodes NA and NB are changed whenever the clock signals CK and CKB vary. Here, Cs represents a parasitic capacitance of the node NB.

First, as shown in FIG. 3A, when the clock signal CK is 0V while the clock signal CKB is VCC (refer to FIG. 2), the capacitor Ca does not conduct a pumping operation while the capacitor Cb conducts a pumping operation. Then, the NMOS transistor N3 is turned on while the NMOS transistor N4 is turned off. Thus, the node NB is boosted up to Vb through the pumping operation by the capacitor Ca. Then node NB decreases to Vb−Vth1 by a threshold voltage Vth1 of the NMOS transistor N3 because node NB is connected to the gate of the NMOS transistor N3.

Next, as shown in FIG. 3B, if the clock signal CK turns to Vcc from 0V while the clock signal CKB turns to 0V from Vcc, the capacitor Ca starts to pump charges while the capacitor Cb does not conduct the pumping operation. Then, the NMOS transistor N3 is turned off while the NMOS transistor N4 is turned on. Thus, the node NA is boosted up to Vb−Vth1+Vcc from Vb−Vth1 by the pumping operation. As a gate of the NMOS transistor N4 is coupled to the node NA, the node NB decreases to Vb−Vth1+Vcc−Vth2 by a threshold voltage Vth2 of the NMOS transistor N4.

And, as shown in FIG. 3C, if the clock signal CK turns to 0V from Vcc while the clock signal CKB turns to Vccc from 0V, the capacitor Cb starts to pump charges again while the capacitor Ca does not conduct the pumping operation. Then, the NMOS transistor N3 is turned on while the NMOS transistor N4 is turned off. Thus, the node NB is boosted up to Vb−Vth1+Vcc−Vth2+rVcc, where r=Cb/(Cb+Cs), from Vb−Vth1+Vcc+Vth2 by the pumping operation.

Here, the maximum voltage gain at the node NB is Vb−Vth1+Vcc−Vth2+rVcc. A practical voltage gain at the node NB is lower than the maximum gain because the NMOS transistor N4 is diode-coupled therein. Thereby, a gate voltage of NMOS transistor N4 is affected from the voltage of node NA, node A decreasing when the voltage level of the node NA falls down.

Accordingly, problems may occur when a voltage level transferred to the node NB, i.e., a charge amount (a source voltage of NMOS transistor N4), becomes lower as time progresses as illustrated in FIG. 4.

As a result, a time for transferring the high voltage VPP as an output signal by the high-voltage switch 11 increases as shown in FIG. 5, which increases even more as the power source voltage Vcc becomes lower.

SUMMARY OF THE INVENTION

The present invention is directed to a high-voltage switching circuit shortening a boosting time of a drive signal for activating a high-voltage switch, reducing a time for transferring a high voltage as an output signal by the high-voltage switch.

In one embodiment, a high-voltage switching circuit comprises: a high-voltage switch configured to transfer a high voltage; a pumping circuit configured to boost signals of first, second, and third nodes by conducting pumping operations in response to a plurality of clock signals; and a drive signal transmission circuit configured to boost the signal of the second node at a constant rate while maintaining a voltage level of the third node regardless of variation of a voltage level at the first node and transfer the boosted signal of the second node to the high-voltage switch, activating the high-voltage switch.

In this embodiment, the high-voltage switching circuit also comprises a boosting enable circuit configured to activate the pumping circuit and the signal transmission circuit.

In this embodiment, the pumping circuit comprises: a first pumping unit configured to boost the first node in response to a first clock signal; a second pumping unit configured to boost the second node in response to a second clock signal; and a third pumping unit configured to boost the third node in response to a third clock signal.

In this embodiment, the drive signal transmission circuit comprises: first and second switching units coupled between a high voltage and the second node in series; and a third switching unit configured to maintain a voltage level of the third node at a constant level regardless of variation of a voltage level at the first node by isolating the first and third node from each other.

In this embodiment, the drive signal transmission circuit comprises: a first switching unit coupled between a high voltage and the first node, having a gate coupled to the second node; a second switching unit coupled between the first node and the second node, having a gate coupled to the third node; and a third switching unit coupled between the first node and the third node, having a gate coupled to the second node.

In this embodiment, the third switching unit separates the first node from the third node, maintaining a voltage level of the third node on a constant level regardless of variation of a voltage level at the first node.

In this embodiment, the plurality of clock signals includes: a first clock signal enabled in a first pulse period; a second clock signal disabled in a second pulse period while the first clock signal is active (e.g., logic high), the second pulse period being narrower than the first pulse period; and a third clock signal disabled in a third pulse period while the first clock signal is active and the second clock signal is inactive (e.g., logic low), the third pulse period being narrower than the second pulse period.

In another embodiment of the present invention, a high-voltage switching circuit comprises: a high-voltage switch configured to transfer a high voltage; a high-voltage switching booster configured to boost a signal for driving the high-voltage switch in response to a plurality of clock signals; and a boosting enable circuit configured to activate the high-voltage switching booster. The high-voltage switching booster comprises: a pumping circuit configured to boost signals of first, second, and third nodes by conducting pumping operations in response to the plurality of clock signals; and a drive signal transmission circuit configured to maintain a voltage level of the third node at a constant level regardless of variation of a voltage level at the first node and transfer the boosted drive signal to the high-voltage switch.

BRIEF DESCRIPTION OF THE DRAWINGS

The accompanying drawings are included to provide a further understanding of the invention, and are incorporated herein and constitute a part of this specification. The drawings illustrate example embodiments of the present invention and, together with the description, serve to explain principles of the present invention. In the drawings.

DETAILED DESCRIPTION OF EMBODIMENTS

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention will be described in conjunction with the accompanying drawings.

Figure 1:
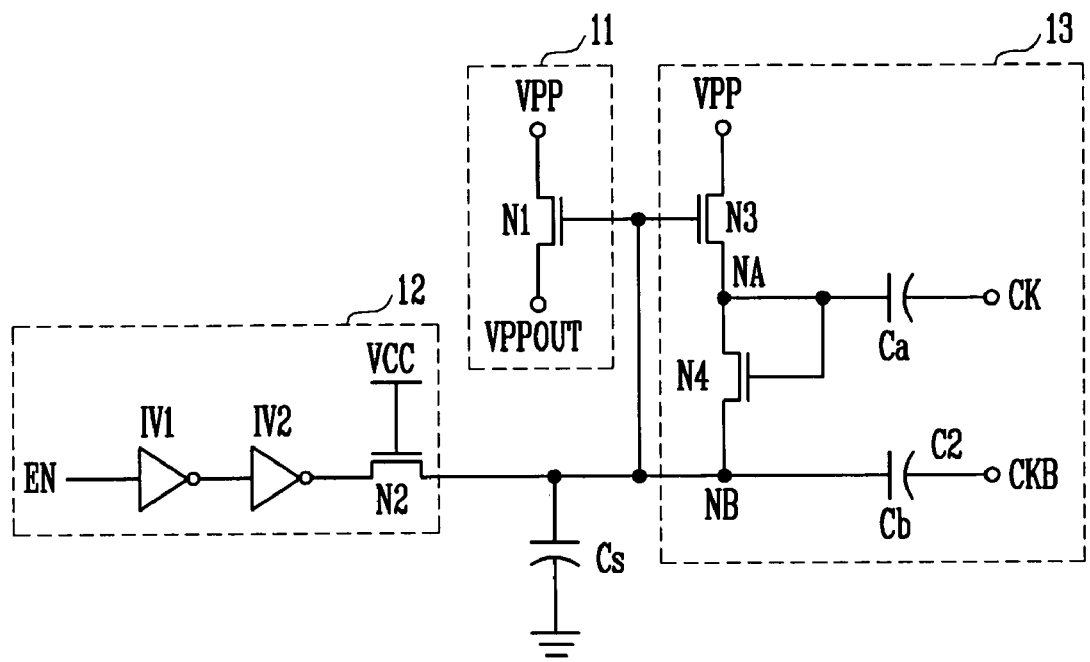
FIG. 1 is a circuit diagram illustrating a conventional high-voltage switching circuit.
Figure 2:
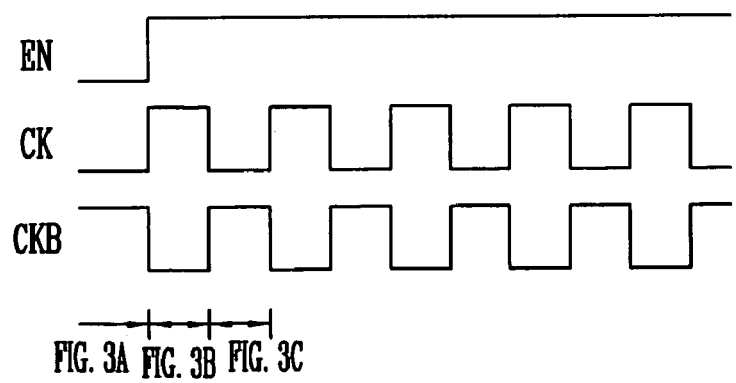
FIG. 2 is a diagram illustrating waveforms of clock signals operating in the high-voltage switching circuit of FIG. 1.
Figure 3A:
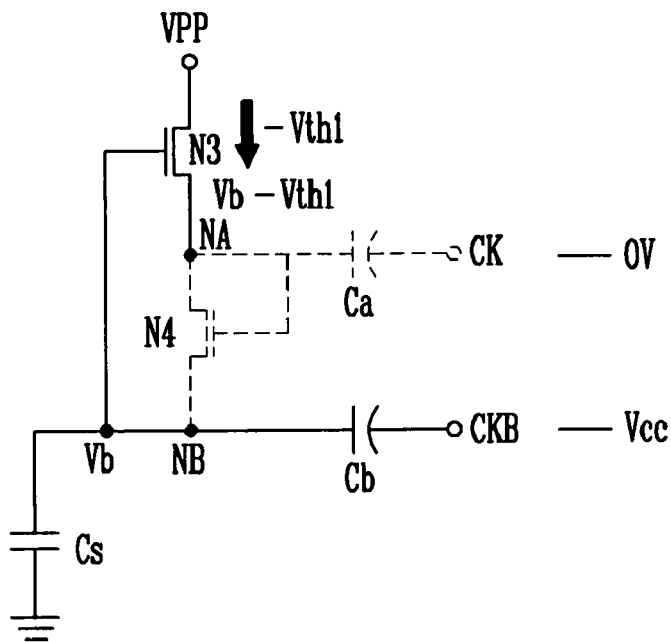
FIGS. 3A through 3C are diagrams illustrating an operation of the high-voltage switching circuit of FIG. 1.
Figure 3B:
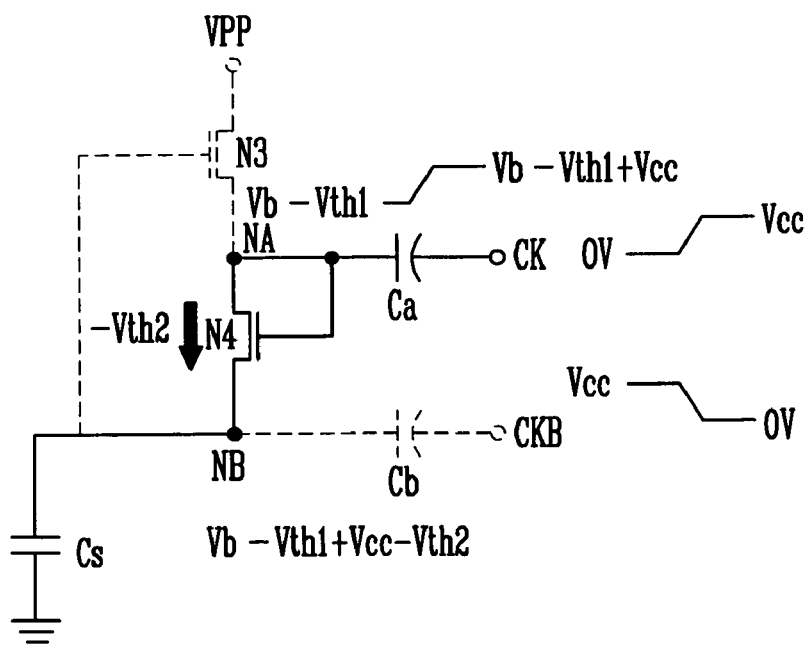
Figure 3C:
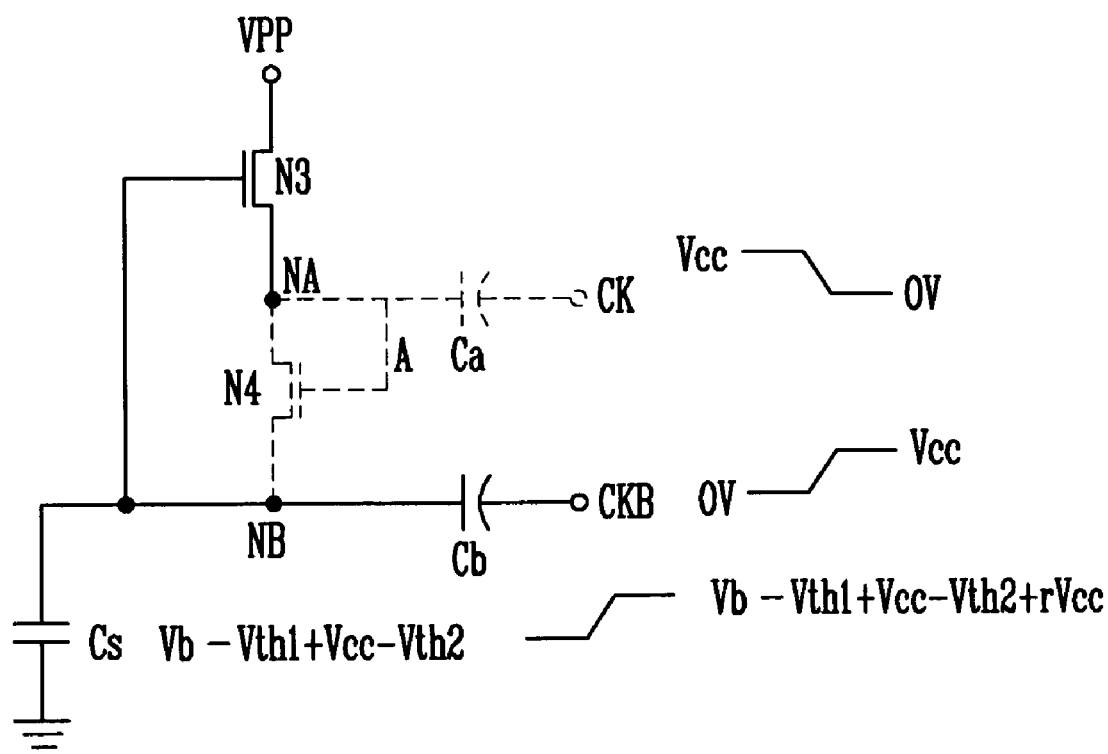
Figure 4:
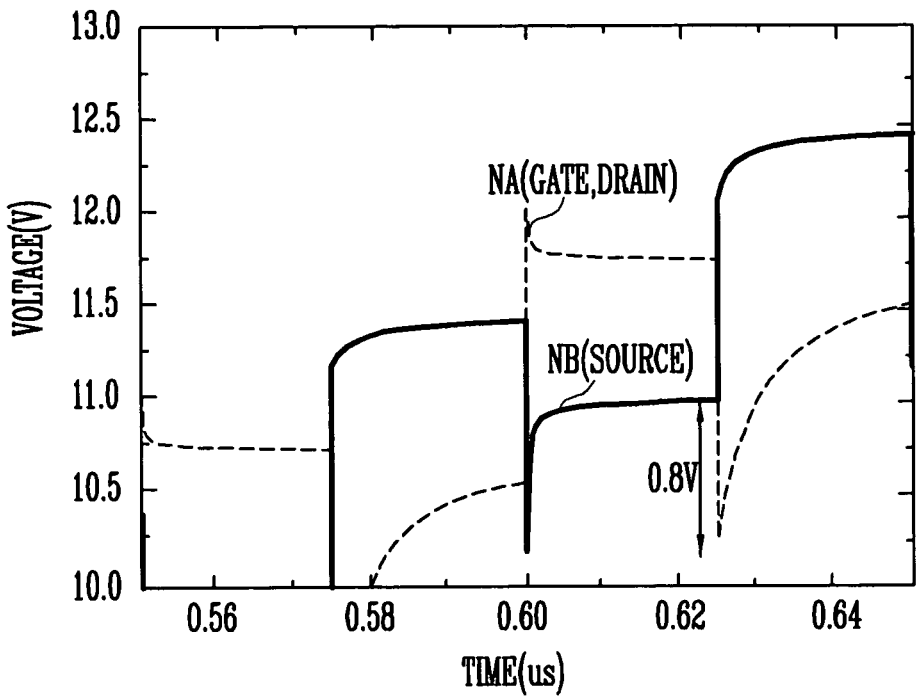
FIG. 4 is a timing diagram illustrating waveforms of signals at nodes NA and NB in the high-voltage switching circuit of FIG. 1.
Figure 5:
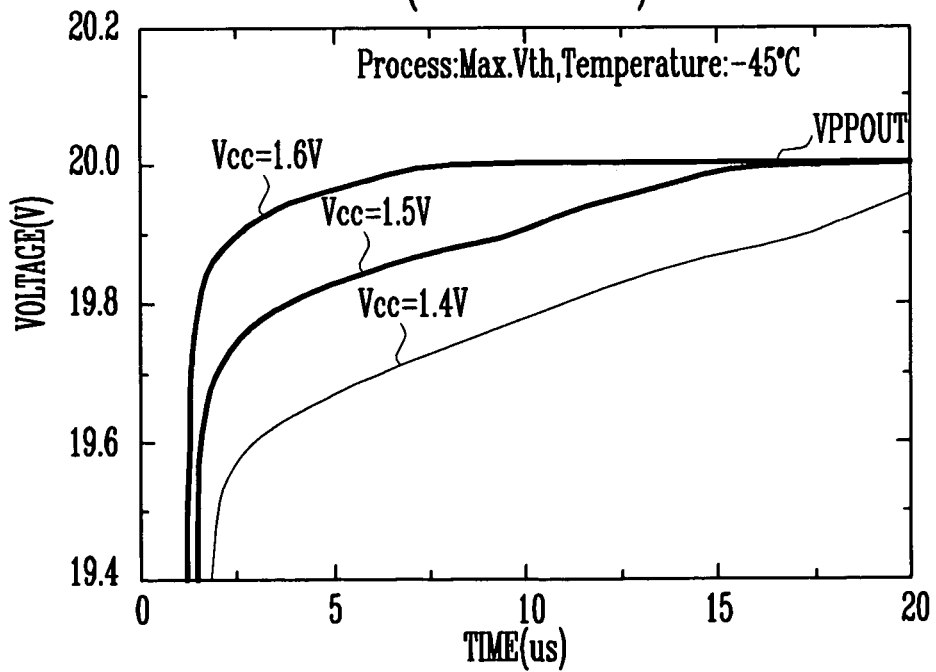
FIG. 5 is a timing diagram illustrating time points outputting a high voltage VPPOUT through the high-voltage switching circuit of FIG. 1.
Figure 6:
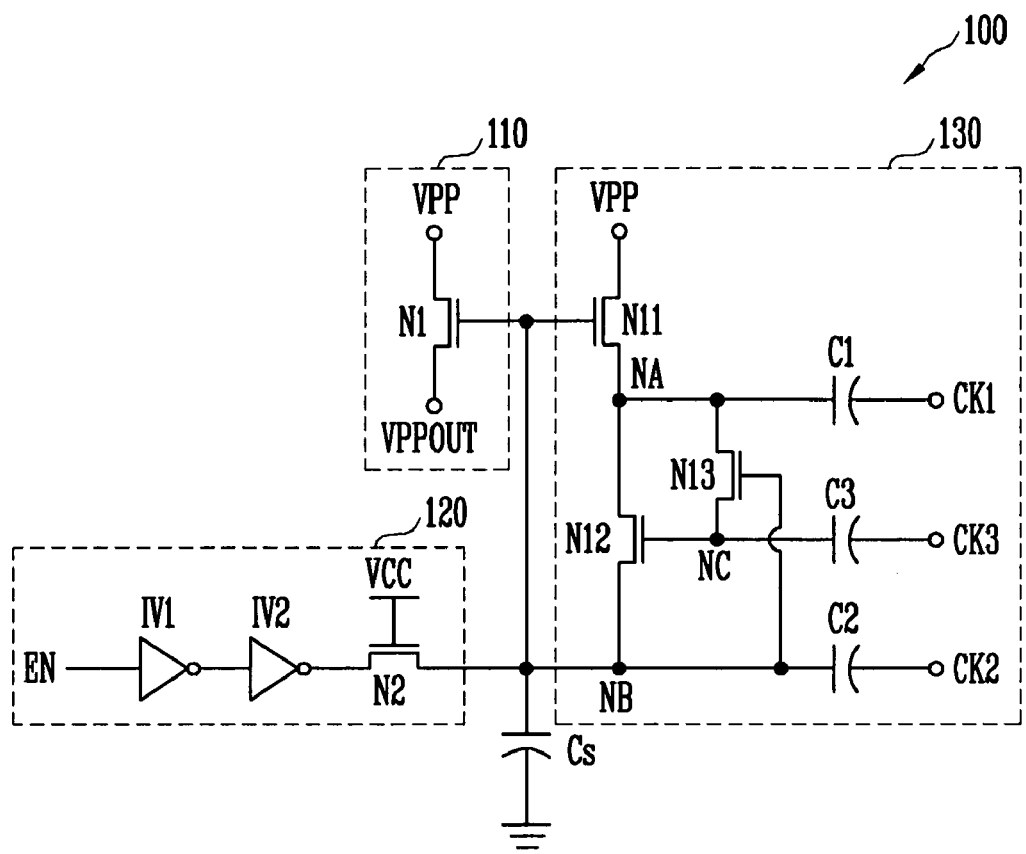
FIG. 6 is a circuit diagram illustrating a high-voltage switching circuit in accordance with one embodiment of the present invention.

FIG. 6 is a circuit diagram illustrating a high-voltage switching circuit in accordance with one embodiment of the present invention.

Referring to FIG. 6, the high-voltage switch circuit 100 includes a high-voltage switch 110, a boosting enable circuit 120, and a high-voltage switching booster 130.

The high-voltage switch 110 includes an NMOS transistor N1 configured to transfer a high voltage VPP as an output signal VPPOUT.

The boosting enable circuit 120 includes inverters IV1 and IV2 and an NMOS transistor N2, activating the high-voltage switching booster 130 in response to an enable signal EN. The inverters, IV1 and IV2, act as a buffer and output the enable signal EN, and the NMOS transistor N2 is turned on by a power source voltage Vcc and transfers the enable signal EN to the high-voltage switching booster 130.

The high-voltage switching booster 130 includes three NMOS transistors N11~N13 and three capacitors C1~C3. Here, Cs represents a parasitic capacitance. One electrode of the capacitor C1 is coupled to the node NA and the other electrode of the capacitor C1 is coupled to a clock signal CK1. One electrode of the capacitor C2 is coupled to the node NB and the other electrode of the capacitor C2 is coupled to a clock signal CK2. One electrode of the capacitor C3 is coupled to the node NC and the other electrode of the capacitor C3 is coupled to a clock signal CK3. The NMOS transistor N11 is coupled between the terminal of the high voltage VPP and the node NA, responding to a signal from the node NB through its gate. The NMOS transistor N12 is coupled between the node NA and the node NB, whose gate is coupled to the electrode of the capacitor C3. The NMOS transistor N13 is coupled between the node NA and the node NC, responding to a signal from the node NB through its gate.

NMOS transistor N13 of the high-voltage switching circuit 100 shown in FIG. 6 is able to maintain a gate voltage of the NMOS transistor N12 at a constant level.

Figure 7:
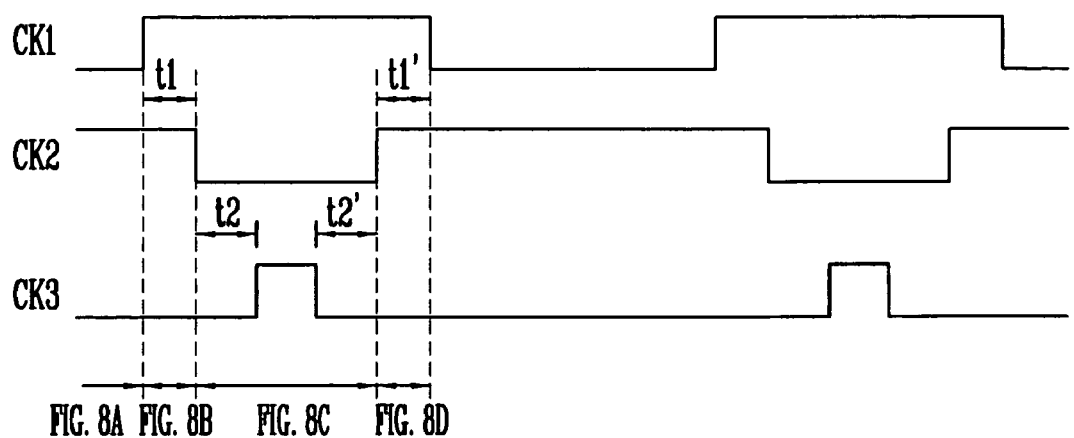
FIG. 7 is a diagram illustrating waveforms of clock signals operating in the high-voltage switching circuit of FIG. 6.

FIG. 7 is a diagram illustrating waveforms of clock signals, CK1, CK2, and CK3, operating in the high-voltage switching circuit of FIG. 6, in which periods, t1, t1', t2, and t2', of the clock signals CK1, CK2, and CK3 may be controllable with values over 0. The clock signal CK1 is enabled (e.g., set to logic high) in a first pulse period. The clock signal CK2 is disabled (e.g., set to logic low) in a second pulse period, which is narrower than the first pulse period, while the clock signal CK1 is active (e.g., remains logic high). The clock signal CK3 is enabled in a third pulse period, which is narrower than the second pulse period, while the clock signal CK1 is active and the clock signal CK2 is inactive (e.g., remains logic low).

FIGS. 8A through 8D are diagrams illustrating an operation of the high-voltage switching booster 130 shown in FIG. 6. Hereinafter, the method of maintaining the gate voltage of the NMOS transistor N12 at a constant level will be described with reference to FIGS. 7, and 8A through 8D.

Figure 8A:
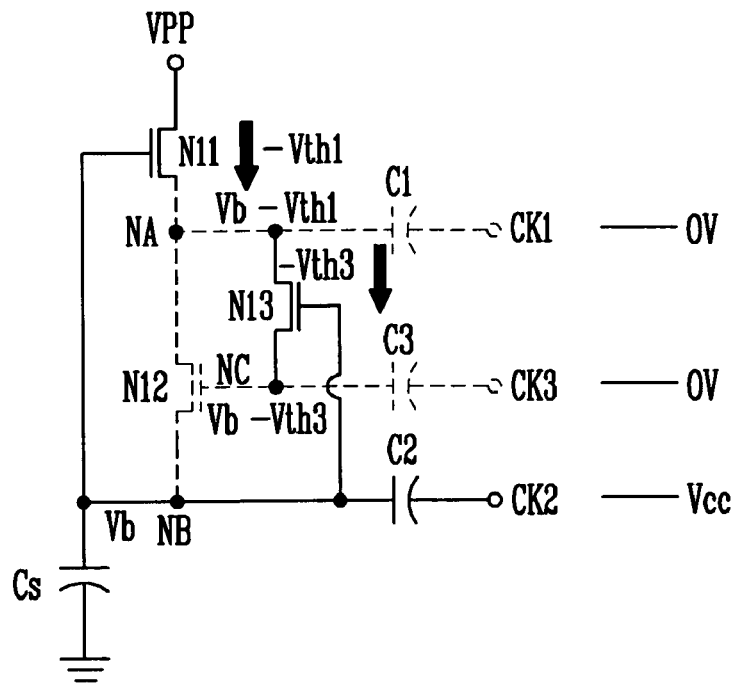
FIGS. 8A through 8D are diagrams illustrating an operation of the high-voltage switching circuit of FIG. 6.

First, as illustrated in FIG. 8A, when the clock signal CK1 is 0V, the clock signal CK3 is 0V, and the clock signal CK2 is Vcc (refer to FIG. 7), the capacitors C1 and C3 do not conduct pumping operations while the capacitor C2 conducts a pumping operation. As a result, NMOS transistors N11 and N13 are turned on and NMOS transistor N12 is turned off. Thus, the node NB is boosted up to Vb by the pumping operation with the capacitor C2, while the voltage at node NA decreases to Vb−Vth1 by a threshold voltage Vth1 of the NMOS transistor N11 because the node NB is coupled to the gate of the NMOS transistor N11. The voltage at node NC decreases to Vb−Vth3 by a threshold voltage Vth3 of the NMOS transistor N13 because the node NB is coupled to the gate of the NMOS transistor N13.

Figure 8B:
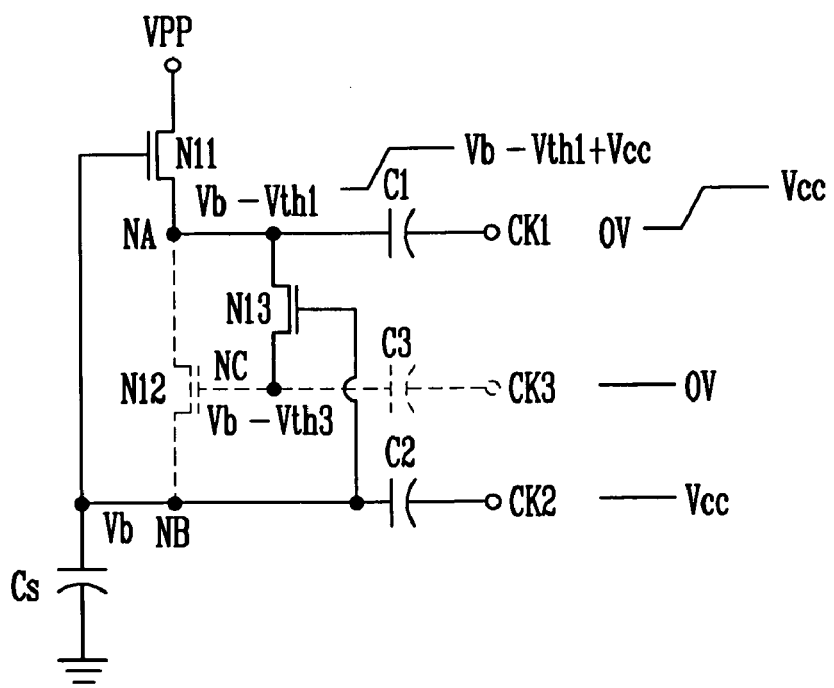

Next, as illustrated in FIG. 8B, when the clock signal CK1 turns to Vcc from 0V, the clock signal CK3 remains at 0V, and the clock signal CK2 remains at Vcc (refer to FIG. 7), the capacitor C1 conducts a pumping operation while the capacitor C3 stops pumping and the capacitor C2 remains pumping. Then, the NMOS transistors N11 and N13 maintain their off state while the NMOS transistor N12 maintains its off state. Thus, the voltage at node NA is boosted to Vb−Vth1+Vcc from Vb−Vth1 while the node NC maintains the voltage level of Vb−Vth3 and the node NB maintains the voltage level of Vb.

Figure 8C:
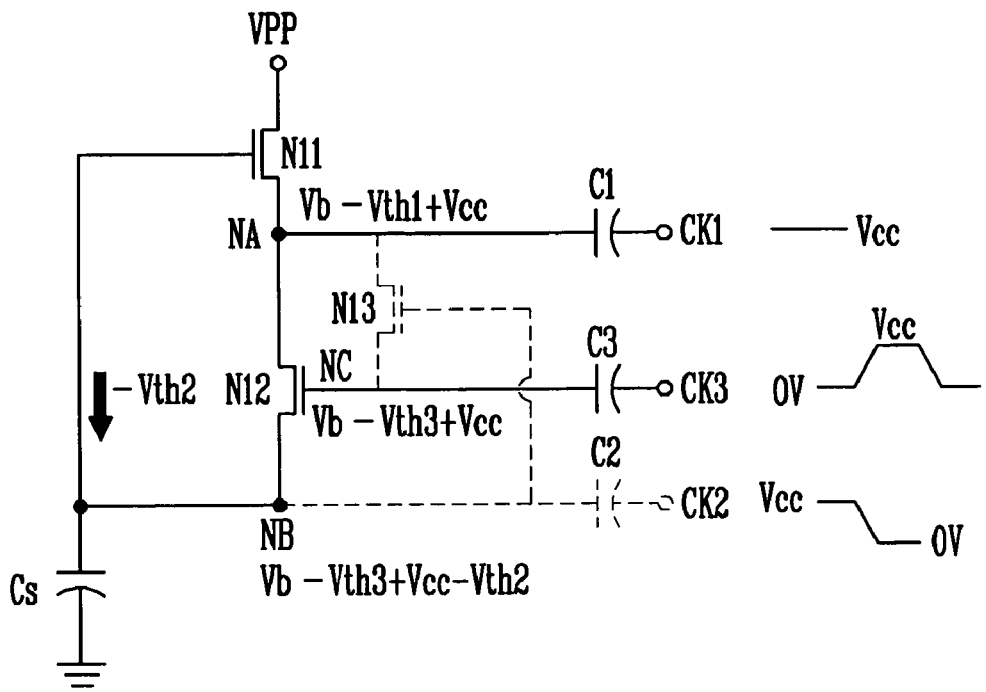

As illustrated in FIG. 8C, when the clock signal CK1 remains at Vcc, the clock signal CK3 returns to 0V after being set to Vcc for a predetermined time, and the clock signal CK2 turns to 0V from Vcc (refer to FIG. 7), the capacitor C1 keeps pumping and the capacitor C3 conducts its pumping operation for a predetermined time (e.g., while CK3 is active) while the capacitor C2 stops pumping. Then, the NMOS transistor N11 maintains its on state while the NMOS transistor N12 is turned on for a time. The NMOS transistor N13 is turned off. Thus, the node NA maintains the voltage level of Vb−Vth1+Vcc while the voltage at node NC is boosted to Vb−Vth3+Vcc for a predetermined time (the gate voltage of the NMOS transistor N12 maintains the voltage level of Vb−Vth3+Vcc without being affected from variation of a voltage level at the node NA). The voltage at node NB decreases to Vb−Vth3+Vcc−Vth2 by the threshold voltage Vth2 of the NMOS transistor N12 because the node NC is coupled to the gate of the NMOS transistor N12.

Figure 8D:
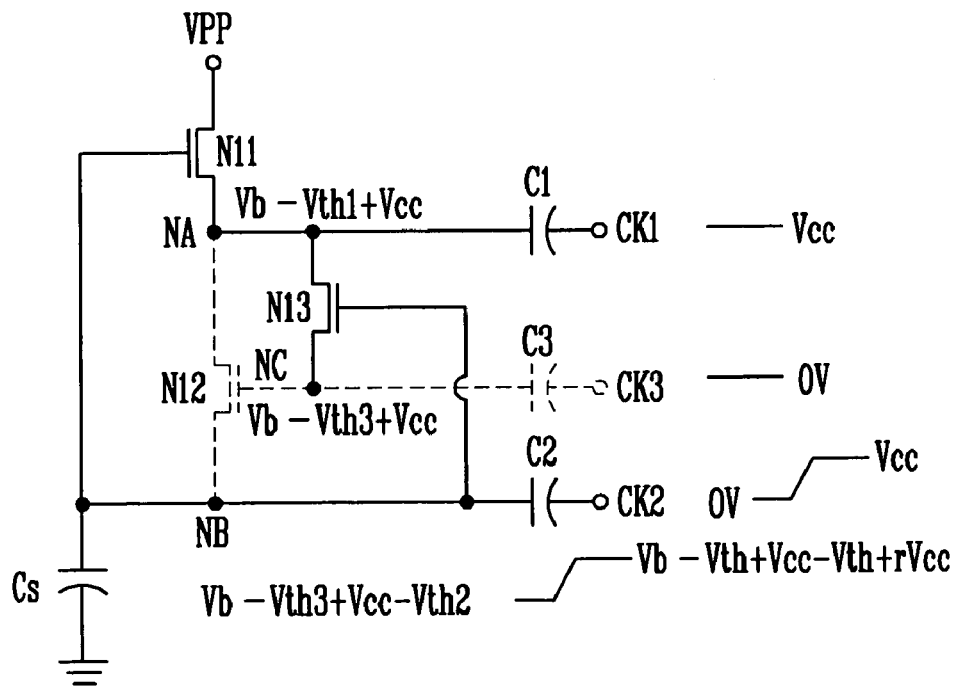

And next, as illustrated in FIG. 8D, when the clock signal CK1 remains at Vcc, the clock signal CK3 is set to 0V, and the clock signal CK2 turns to Vcc from 0V (refer to FIG. 7), the capacitor C1 keeps pumping while the capacitor C3 stops pumping and the capacitor C2 resumes its pumping operation. Then, the NMOS transistor N11 maintains its on state while the NMOS transistor N12 is turned off and the NMOS transistor is turned on again. Thus, the node NA maintains the voltage level of Vb−Vth1+Vcc while the voltage at node NB is boosted to Vb−Vth3+Vcc−Vth2+rVcc (here, r is Cb/(Cb+Cs) in consideration of parasitic capacitance). And, the voltage at node NC remains at Vb−Vth3+Vcc by directly transferring a drain voltage of the NMOS transistor N13 thereto without a voltage drop because a gate voltage of the NMOS transistor N13, Vb−Vth3+Vcc−Vth2+rVcc, is higher than the drain voltage Vb−Vth3+Vcc.

As stated above, by the operation of the high-voltage switching booster 130, the gate voltage of the NMOS transistor N12 maintains the level of Vb−Vth3+Vcc regardless of variation of the voltage level at the node NA because the gate of the NMOS transistor N12, i.e., the node NC, is separated from the drain of the NMOS, i.e., the node NA, transistor N12 by the NMOS transistor N13 after the step of FIG. 8C where the clock signal CK3 goes to a logic high level.

Figure 9:
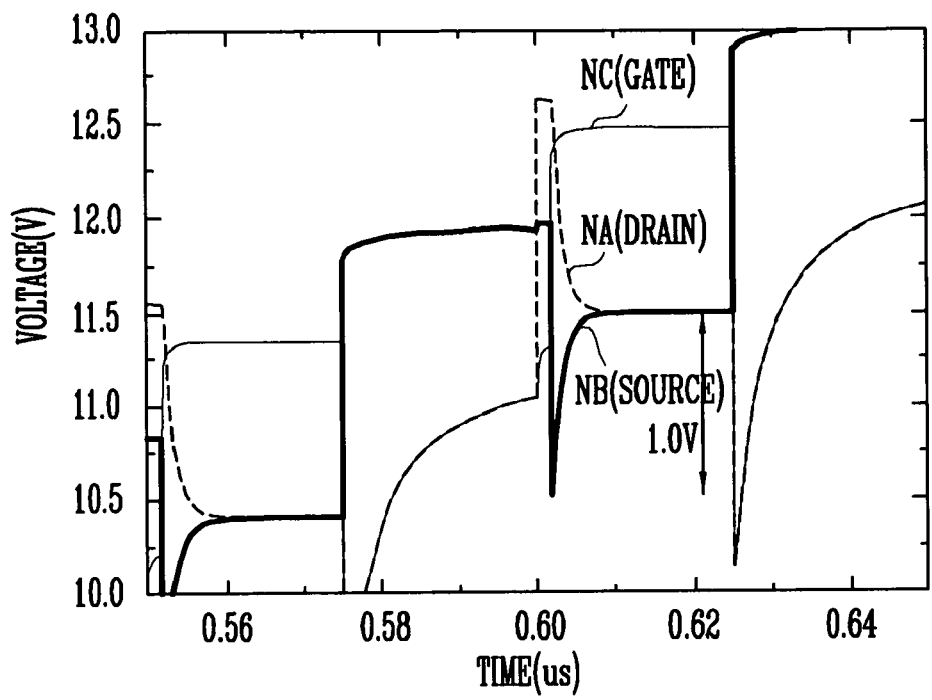
FIG. 9 is a timing diagram illustrating waveforms of signals at nodes NA, NB, and NC in the high-voltage switching circuit of FIG. 6.
Figure 10:
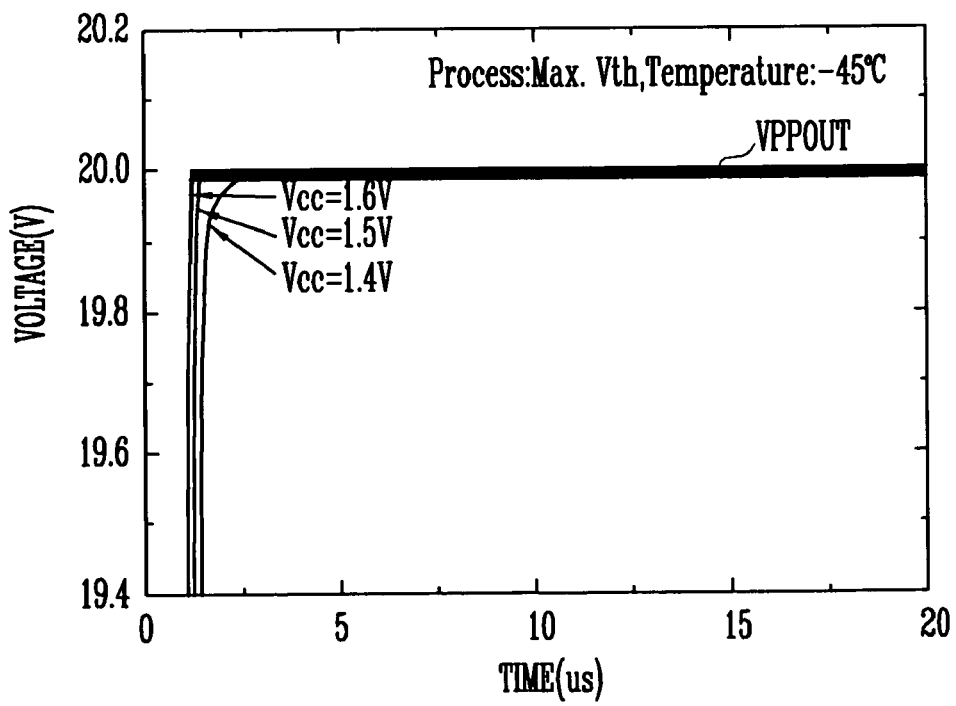
FIG. 10 is a timing diagram illustrating time points outputting a high voltage VPPOUT through the high-voltage switching circuit of FIG. 6.

FIG. 9 is a timing diagram illustrating waveforms of signals at nodes NA, NB, and NC in the high-voltage switching circuit of FIG. 6, as a result of simulation for the high-voltage switching booster, and FIG. 10 is a timing diagram illustrating time points outputting the high voltage output signal VPPOUT through the high-voltage switching circuit of FIG. 6.

Referring to FIG. 9, a voltage level of the source of the NMOS transistor N12, i.e., the voltage level of the node NB (i.e., the solid black line), rises because the voltage level of the node NC, i.e., the gate voltage of the NMOS transistor N12, becomes high as time progresses.

As illustrated in FIG. 10, times for outputting the high voltage signal VPPOUT are shown. The voltage VPPOUT has a boosting characteristic despite decreases in the voltage of Vcc.

The present invention can transfer a high voltage faster than a conventional case although the power source voltage Vcc decreases.

The present invention is advantageous in improving the efficiency of high-voltage switching operation in the application with a low power source voltage.

Although the present invention has been described in connection with specific embodiments of the present invention illustrated in the accompanying drawings, it is not limited thereto. It will be apparent to those ordinary skilled in the art that various substitutions, modifications and changes may be made thereto without departing from the scope and spirit of the invention.

What is claimed is:

1. A non-volatile memory device comprising:
a high-voltage switch configured to transfer a voltage higher than an external power source supplying voltage to the device;
a pumping circuit including first, second, and third nodes, the pumping circuit configured to boost signals of the first, second, and third nodes by conducting pumping operations in response to a plurality of clock signals; and
a drive signal transmission circuit configured to boost the signal of the second node at a constant rate while maintaining a voltage level of the third node regardless of variation of a voltage level at the first node and to transfer the boosted signal of the second node to the high-voltage switch.

2. The device as set forth in claim 1, further comprising a boosting enable circuit configured to activate the pumping circuit and the drive signal transmission circuit.

3. The device as set forth in claim 1, wherein the pumping circuit comprises:
a first pumping unit configured to boost the first node in response to a first clock signal;

a second pumping unit configured to boost the second node in response to a second clock signal; and a third pumping unit configured to boost the third node in response to a third clock signal.

4. The device as set forth in claim 1, wherein the drive signal transmission circuit comprises:

first and second switching units coupled between a given node having the voltage higher than the external power source supplying voltage and the second node; and a third switching unit configured to maintain a voltage level of the third node at a constant level regardless of variation of the voltage level at the first node.

5. The device as set forth in claim 1, wherein the drive signal transmission circuit comprises:

a first switching unit coupled between a given node having the voltage higher than the external power source supplying voltage and the first node, the first switching unit having a gate coupled to the second node;

a second switching unit coupled between the first node and the second node, the second switching unit having a gate coupled to the third node; and a third switching unit coupled between the first node and the third node, the third switching unit having a gate coupled to the second node.

6. The device as set forth in claim 5, wherein the third switching unit is configured to separate the first node from the third node, maintaining a voltage level of the third node at a constant level regardless of variation of the voltage level at the first node.

7. The device as set forth in claim 1, wherein the plurality of clock signals includes:

a first clock signal enabled in a first pulse period;

a second clock signal disabled in a second pulse period while the first clock signal is active, the second pulse period being narrower than the first pulse period; and a third clock signal disabled in a third pulse period while the first clock signal is active and the second clock signal is inactive, the third pulse period being narrower than the second pulse period.

8. A non-volatile memory device comprising:

a high-voltage switch configured to transfer a voltage higher than an external power source supplying voltage to the device;

a high-voltage switching booster configured to boost a signal for driving the high-voltage switch in response to a plurality of clock signals; and a boosting enable circuit configured to activate the high-voltage switching booster, wherein the high-voltage switching booster comprises:

a pumping circuit including first, second, and third nodes, the pumping circuit configured to boost signals of the first, second, and third nodes by conducting pumping operations in response to the plurality of clock signals; and a drive signal transmission circuit configured to maintain a voltage level of the third node at a constant level regardless of variation of a voltage level at the first node and to transfer the boosted drive signal to the high-voltage switch.

9. The device as set forth in claim 8, wherein the pumping circuit comprises:

a first pumping unit configured to boost the first node in response to a first clock signal;

a second pumping unit configured to boost the second node in response to a second clock signal; and a third pumping unit configured to boost the third node in response to a third clock signal.

10. The device as set forth in claim 8, wherein the drive signal transmission circuit comprises:

first and second switching units coupled between a given node having the voltage higher than the external power source supplying voltage and the second node; and a third switching unit configured to maintain a voltage level of the third node at a constant level regardless of variation of the voltage level at the first node.

11. The device as set forth in claim 8, wherein the drive signal transmission circuit comprises:

a first switching unit coupled between a given node having the voltage higher than the external power source supplying voltage and the first node, the first switching unit having a gate coupled to the second node;

a second switching unit coupled between the first node and the second node, the second switching unit having a gate coupled to the third node; and a third switching unit coupled between the first node and the third node, the third switching unit having a gate coupled to the second node.

12. The device as set forth in claim 11, wherein the third switching unit is configured to separate the first node from the third node, maintaining a voltage level of the third node at a constant level regardless of variation of the voltage level at the first node.

13. The device as set forth in claim 8, wherein the plurality of clock signals includes:

a first clock signal enabled in a first pulse period;

a second clock signal disabled in a second pulse period while the first clock signal is active, the second pulse period being narrower than the first pulse period; and a third clock signal disabled in a third pulse period while the first clock signal is active and the second clock signal is inactive, the third pulse period being narrower than the second pulse period.

* * * * *